United States Patent [19]

Tominari

[11] Patent Number: 4,873,722
[45] Date of Patent: Oct. 10, 1989

[54] MULTI-CHANNEL REPRODUCING SYSTEM

[75] Inventor: Noboru Tominari, Tokyo, Japan

[73] Assignee: Dynavector, Inc., Tokyo, Japan

[21] Appl. No.: 111,075

[22] Filed: Oct. 15, 1987

Related U.S. Application Data

[63] Continuation of Ser. No. 867,234, May 23, 1986, abandoned.

[30] Foreign Application Priority Data

Jun. 7, 1985 [JP] Japan ................................ 60-123630

[51] Int. Cl.$^4$ ............................................. H04S 5/00
[52] U.S. Cl. ......................................... 381/17; 381/63
[58] Field of Search ............................... 381/1, 17, 63; 84/DIG. 26

[56] References Cited

U.S. PATENT DOCUMENTS

| | | | |
|---|---|---|---|
| 3,670,106 | 6/1972 | Orban | 381/17 |
| 4,349,698 | 9/1982 | Iwahara . | |
| 4,566,119 | 1/1986 | Peters | 381/103 |
| 4,594,729 | 6/1986 | Weingartner | 381/86 |
| 4,603,429 | 7/1986 | Carver | 381/18 |
| 4,653,096 | 3/1987 | Yokoyama | 381/63 |
| 4,694,497 | 9/1987 | Kasai et al. | 381/17 |
| 4,706,287 | 11/1987 | Blackmer et al. | 381/17 |

FOREIGN PATENT DOCUMENTS

| | | |
|---|---|---|
| 55-047797 | 4/1980 | Japan ................................ 381/63 |
| 916843 | 1/1963 | United Kingdom . |
| 1578854 | 11/1980 | United Kingdom . |
| 1579571 | 11/1980 | United Kingdom . |

OTHER PUBLICATIONS

Chamberlin, Musical Applications of Microprocessors, 1980, pp. 447–451.

*Primary Examiner*—Forester W. Isen
*Attorney, Agent, or Firm*—Ladas & Parry

[57] ABSTRACT

A multi-channel reproducing system comprises main speakers for sounding an input audio signal as a main channel audio signal, a phase shifter supplied with the input audio signal for shifting a phase thereof, and sub-speakers supplied with an output signal from the phase shifter as a sub-channel audio signal for sounding the sub-channel audio signal. The phase shifter has a frequency versus delay time characteristic in which a delay becomes large as the frequency decreases and small as the frequency increases.

2 Claims, 3 Drawing Sheets

MULTI-CHANNEL REPRODUCING SYSTEM

This is a continuation of co-pending application Ser. No. 867,234 filed on May 23, 1986 now abandoned.

BACKGROUND OF THE INVENTION

The present invention generally relates to multi-channel reproducing systems, and more particularly to a multi-channel reproducing system for reproducing audio signals in such a manner that a listener can listen to a reproduced sound with a presence which gives a feeling as if the listener is in a concert hall.

Generally, a listener in a concert hall listening to a music performed on a stage simultaneously hears a direct sound from a playing sound source and an indirect sound reflected from inner walls of the hall. The direct sound traveling directly to the listener from the sound source and the indirect sound traveling to the listener after being reflected by the inner walls have a difference in time for the sounds to reach the listener. Because of this arrival time difference $\Delta T$ in the sounds reaching the listener, the listener can feel that he is listening to the musical performance in a concert hall.

Accordingly, there is a conventional four-channel reproducing system intended for reproducing audio signals picked up from a record disc or a tape so that the listener can hear the reproduced audio signal with a presence as if the listener is in a concert hall. In this system, two-channel stereo audio signals are reproduced and sounded from two main speakers as they are, while the aforementioned two-channel stereo audio signals are delayed for a predetermined time period by a digital delay circuit, for example, and delayed signals thus obtained are reproduced and sounded from two sub-speakers which are independent of the two main speakers.

However, this conventional four-channel reproducing system has a problem in that, although the system is capable of producing the presence more or less as compared to conventional simple two-channel reproducing systems, the sound in a high frequency range higher than about 4 kHz introduces an echo which is unnatural, and accordingly, the presence in the actual concert hall cannot be obtained.

The reason why this problem occurs was studied using recent reasearches and architectural acoustic data, which led to a finding that the arrival time difference $\Delta T$ between the direct sound and the indirect sound does not only change with the distance from the sound source but also changes with the frequency of the audio signal. Thus, as the audio signal frequency becomes lower, the time difference $\Delta T$ increases, and as the frequency becomes higher, the time difference $\Delta T$ approaches a small constant value.

In the conventional system as described, the audio signal is delayed by the predetermined delay time uniformly throughout the whole frequency range irrespective of the frequency. Therefore, when the delay time of 100–200 msec is chosen in order to obtain a sufficient presence, the high frequency component having the delay time as described will result in an echo and causes a problem in that the presence becomes unnatural. On the other hand, when the delay time is shortened to 20 to 30 msec to eliminate the echo, a sufficient presence cannot be obtained.

SUMMARY OF THE INVENTION

Accordingly, it is a general object of the present invention to provide a novel and useful multi-channel reproducing system in which the problems of the conventional system are eliminated based on the aforementioned finding.

Another and more specific object of the present invention is to provide a multi-channel reproducing system for sounding main audio signals from main speakers, wherein the system is arranged to delay the aforementioned main audio signals with a delay time which is long in a low frequency range and short in a high frequency range so as to form sub-audio signals which are sounded from sub-speakers. According to the system of the present invention, an extremely natural presence is obtainable through the whole frequency range, and a listener can listen in a state as if he is listening in a concert hall.

Other objects and further features of the present invention will be apparent from the following detailed description when read in conjunction with the accompanying drawings.

DETAILED DESCRIPTION

Figure 1:
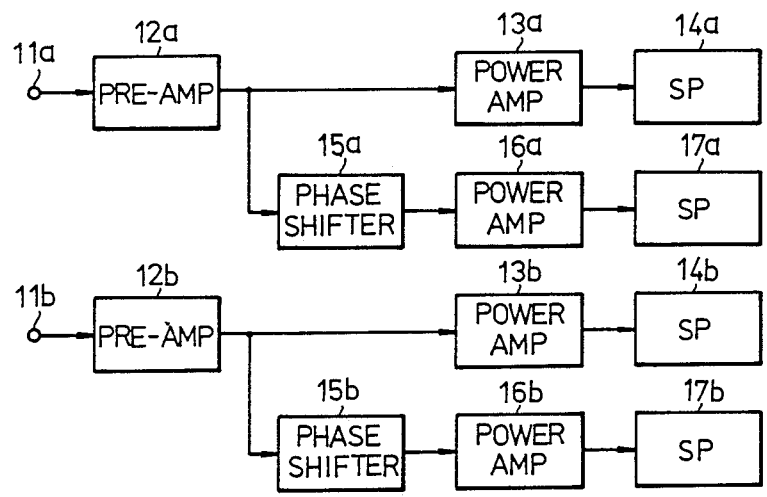
FIG.1 is a system block diagram showing a first embodiment of the multi-channel reproducing system according to the present invention.

Referring to FIG.1, stereo signals of the right and left channels are applied to input terminals 11a and 11b from a source such as a disc player, tape recorder, tuner and the like. The right and left channel signals from the terminals 11a and 11b are subjected to processing such as equalization, tone control and the like in respective preamplifiers 12a and 12b, and are then supplied on one hand to power amplifier 13a and 13b for amplification to produce main audio signals for the right and left channels. The main audio signals are supplied to right and left speakers 14a and 14b for generating sound. The outputs of the preamplifiers 12a and 12b, on the other hand, are further supplied to phase shifters 15a and 15b which constitute an essential part of the system according to the present invention and wherein the phases thereof are shifted as will be described later on in the present specification. The output signals of the phase shifters 15a and 15b are amplified in power amplifiers 16a and 16b to produce sub-audio signals for the right and left channels which are then supplied to right and left sub-speakers 17a and 17b for generating sound. As will be described later, the phase shifters 15a and 15b have a constant gain throughout the entire frequency range. The phase shifters 15a and 15b further have a delay characteristic for producing a phase delay which approaches a small value as the frequency becomes low and approaches a large value as the frequency becomes high.

Figure 7:
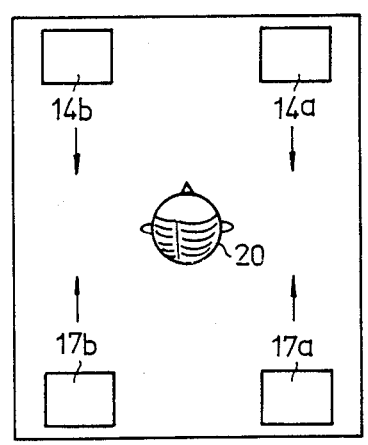
FIG.7 is a diagram showing an example of speaker arrangement used in the system according to the present invention.

The respective speakers aforementioned are arranged as shown in FIG.7. The right and left main speakers 14a and 14b are disposed in a front right position and a front left position to a listener 20, while the right and left sub-speakers 17a and 17b are disposed in a rear right position and a rear left position to the listener 20 in such a manner that they face the main speakers 14a and 14b. The sub-speakers 17a and 17b need not necessarily oppose the main speakers 14a and 14b strictly, but may be offset within a certain angle (30° for example). Further, the main speakers 14a and 14b may be disposed in front right and front left positions to the listener at a higher position in a downwardly declined manner while disposing the sub-speakers 17a and 17b in rear right and rear left positions to the listener at a lower position in an upwardly inclined manner. In any event, the presence is enhanced by disposing the main speakers and sub-speakers in such a manner that the generations of sound are not directed in the same direction but are directed in a generally opposing manner to each other.

The listener 20 hears sounds of the right and left channels from the main speakers 14a and 14b together with the sounds having a positional delay (also time delay) from the sub-speakers 17a and 17b. Thus, the listener can feel the presence as if the listener is listening in a concert hall.

Next, the phase shifters 15a and 15b will be described. Generally, Laplace transforms of an original signal h(t) and a signal h(t−Δt) which has been delayed by a time Δt in the whole frequency range therefrom are respectively described by the following equations, where s is the Laplace's operator.

$$[-\Delta]L[h(t)] = H(s) \tag{1}$$

$$[-\Delta]L[h(t-\Delta t)] = H(s) \cdot e^{-s \cdot \Delta t} \tag{2}$$

Thus, it can be seen that the transfer function used in conventional reproducing system having a constant delay throughout the whole frequency range is represented as $e^{-s \cdot \Delta t}$, and the gain and phase of which are described respectively by the following equations, where f is the frequency.

$$|e^{-s \cdot \Delta t}| = 1 \tag{3a}$$

$$\angle e^{-s \cdot \Delta t} = -2\pi f \cdot \Delta t \tag{3b}$$

Figure 2:
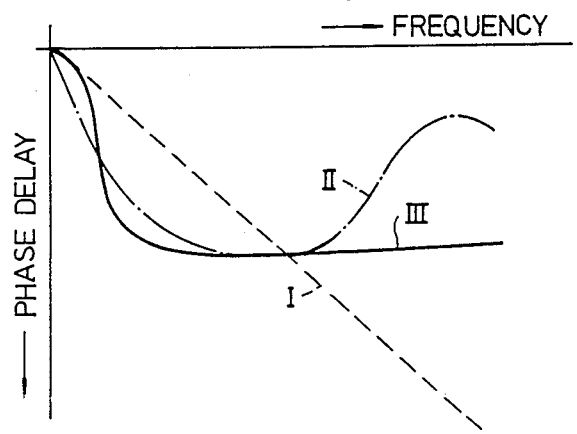
FIG.2 is a graph for explaining a frequency versus phase delay characteristic.

The frequency versus phase characteristic of the conventional delay circuit represented by the equation (3a) is as shown in FIG.2 by a broken line I.

The time difference between the direct sound and the indirect sound in a concert hall becomes larger as the frequency of the sound becomes lower, and becomes smaller as the frequency becomes higher. This relationship is approximated by the following equation, where $\Delta T_{MIN}$ is a time delay when the frequency is infinite and $\Delta T_O$ is an increment corresponding to a time delay to be added to $\Delta T_{MIN}$ when the frequency is zero.

$$\Delta T = \Delta T_O \cdot e^{-f} + \Delta T_{MIN} \tag{4}$$

Figure 3:
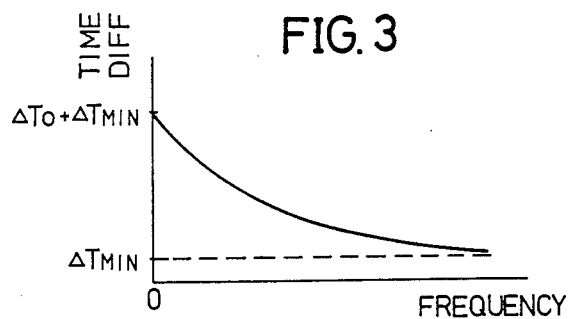
FIG.3 is a graph showing a time difference versus frequency characteristic of sound in a concert hall.

A plot of the time difference represented by the equation (4) is shown in FIG.3. By substituting the time difference ΔT of the equation (4) into the delay time Δt of the equation (2), a transfer function in the concert hall is obtained. The phase of the transfer function is described by the following equation.

$$\angle e^{-s \cdot \Delta T} = -2\pi f(\Delta T_O \cdot e^{-f} + \Delta T_{MIN}) \tag{5}$$

The frequency versus phase characteristic represented by the equation (5) is shown by a one-dot chain line II in FIG.2. As can be seen from FIG.2, the frequency versus phase characteristic I for the conventional four channel reproducing system is completely different from the frequency versus phase characteristic II for the concert hall, and if is this difference in the characteristics which causes the unnatural presence in the conventional four channel reproducing system.

The phase shifters 15a and 15b according to the present invention shown in FIG. 1 are designed to have a frequency versus phase characteristic shown in FIG. 2 by a solid line III which is made more closely approximate the characteristic II than the characteristic I.

Figure 4:
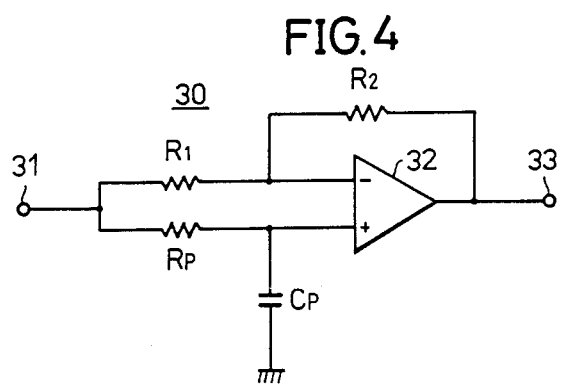
FIG.4 is a circuit diagram showing an embodiment of a phase shifting circuit constituting a phase shifter in FIG.1.

The phase shifters 15a and 15b are respectively constituted by a plurality of stages (ten-odd stages, for example) of cascaded a phase shifting circuit 30 shown in FIG. 4. In FIG. 4, a signal input terminal 31 is connected to an inverting input terminal and a non-inverting input terminal of an operational amplifier 32 through respective resisters $R_1$ and $R_p$. The output side of the operational amplifier 32 is connected to an output terminal 33 and to the non-inverting input terminal of the operational amplifier 32 through a feed back resister $R_2$. Further, the non-inverting input terminal of the operational amplifier 32 is connected to ground through a capacitor $C_p$. The resisters $R_1$ and $R_2$ have the same resistance, and the gain for the entire frequency range is set to unity. A transfer function $G_1(s)$ corresponding to the above phase shifting circuit 30 is described by the following equation, where $\tau_1$ represents a time constant which is defined by $\tau_1 = R_p \cdot C_p$.

$$G_1(s) = \frac{1 - \tau_1 \cdot s}{1 + \tau_1 \cdot s} \tag{6}$$

Figure 5:
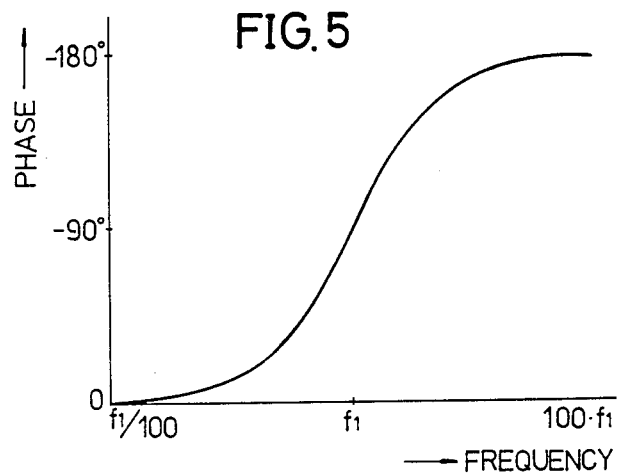
FIG.5 is a graph showing a frequency versus phase delay characteristic of the phase shifting circuit shown in FIG.4.

The phase shifting circuit 30 has a frequency versus phase characteristic shown in FIG. 5, in which the phase in a high frequency range higher than a frequency of $100 \cdot f_1$ is delayed (retarded) by 180° relative to the phase in the low frequency range lower than a frequency of $f_1/100$.

The transfer frunction G(s) of a phase shifter which is constituted by cascading the phase shifting circuits 30 in n stages (n is an integer greater than or equal to two) is described by the following equation:

$$\begin{aligned} G(s) &= G_1(s) \cdot G_2(s) \cdot \ldots \cdot G_n(s) \\ &= \frac{1 - \tau_1 \cdot s}{1 + \tau_1 \cdot s} \cdot \frac{1 - \tau_2 \cdot s}{1 + \tau_2 \cdot s} \cdot \ldots \cdot \frac{1 - \tau_n \cdot s}{1 + \tau_n \cdot s} \\ &= \prod_{i=1}^{n} \left( \frac{1 - \tau_i \cdot s}{1 + \tau_i \cdot s} \right) \end{aligned} \tag{7}$$

The phase $\angle G(s)$ for the transfer function G(s) is represented by the following equation and the value of the phase G(s) approaches $-(n \cdot 180°)$ as the frequency becomes higher.

$$\angle G(s) = \angle G_1(s) + \angle G_2(s) + \ldots + \angle G_n(s) \quad (8)$$

In a case where the time constants $\tau_1, \tau_2, \ldots, \tau_n$ of the aforementioned n phase shifting circuits are all equal to $\tau$, the transfer function G(s) takes the following form, and in this case, the frequency versus phase relationship becomes the one shown in FIG.2 by the solid line III.

$$G(s) = \left(\frac{1 - \tau \cdot s}{1 + \tau \cdot s}\right)^n \quad (9)$$

Thus, the phase shifters 15a and 15b respectively have a frequency versus phase characteristic III approximately the frequency versus phase characteristic II of the concert hall in the mid and low frequency ranges. Therefore, the listener can listen to the sounds respectively reproduced by the main speakers 14a and 14b and the sub-speakers 17a and 17b with presence which is extremely close to the feeling in a concert hall. In addition, the higher frequency component (higher than 1000 Hz, for example) in the reproduced sound does not introduce a feeling of echo to the listener. Further, each channel requires only one set of phase shifting circuits, so that is not necessary to use other circuits such as a filter circuit or a matrix circuit. Thus, the construction of the system is simple.

One example of the circuit constants used in the phase shifting circuit 30 in FIG. 4 is as follows:

$$R_1 = R_2 = R_p = 39 \text{ k}\Omega$$

Capacitor $C_p = 0.08 \mu F$.

Figure 6:
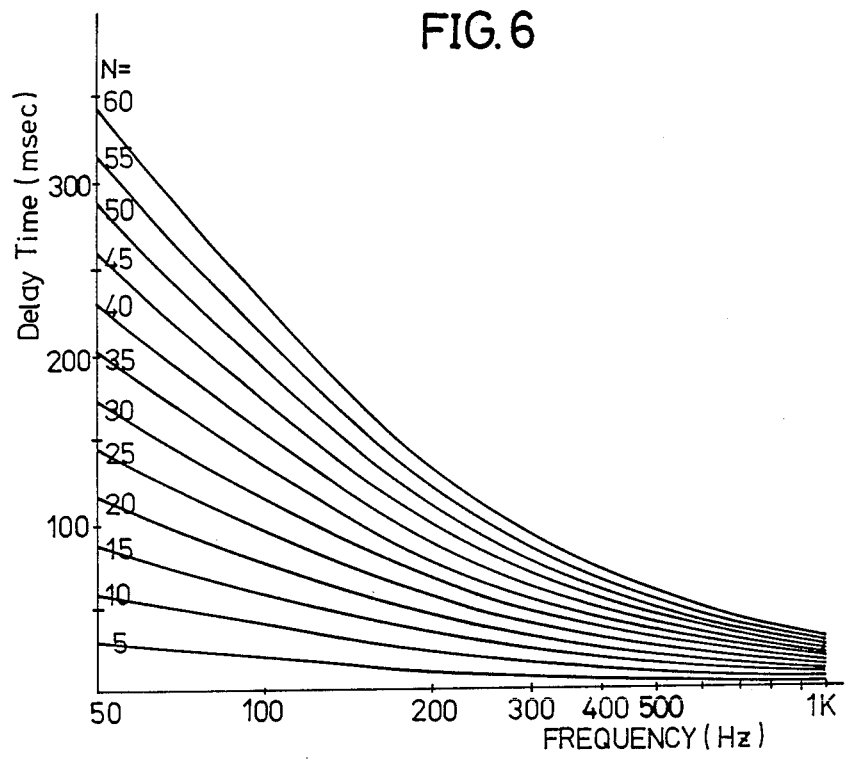
FIG.6 is a graph showing a frequency versus phase delay characteristic of the phase shifting circuit shown in FIG.4 with a number of connected stages as a parameter.

The frequency versus delay time characteristic of a phase shifter using a n cascaded phase shifting circuits 30 respectively having the circuits constants referred to above is shown in FIG. 6 with a parameter n which is the number of the connected stages. In FIG. 6, the cases corresponding to n = 5, 10, 15, ... 50, 55, and 60 are respectively shown.

It is also possible to construct a phase shifter to have a frequency versus phase characteristic which is similar to the characteristic shown by the one-dot chain line II in FIG. 2 by cascading the phase shifting circuits having varying transfer functions. In this case, the value of the transfer functions $G_1(s), G_2(s), \ldots G_n(s)$ are varied as desired by varying the time constants $\tau_1, \tau_2, \ldots \tau_n$ by using resisters $R_p$ and capacitors $C_p$ which are varied accordingly.

In addition, the phase shifting circuit is not limited to the one shown in FIG. 4, but may have other circuit constructions. For example, a digital filter and the like designed on the basis of a pulse transfer function obtained by a Z-transform of the equation (7) may be used for the aforementioned phase shifting circuit. Moreover, the main audio signal to be reproduced is not limited to the signal in the two-channel stereo system but may also be a signal in other systems such a monaural or four channel systems and the like.

Further, the present invention is not limited to these embodiments but various variations and modifications may be made without departing from the scope of the invention.

What is claimed is:

1. A multi-channel reproducing system for reproducing a sound with presence so that a listener can listen to the reproduced sound with a feeling as if he is listening to the sound in a concert hall, by simulating the effect of dispersion caused in the spectrum of an indirect sound which is produced in the concert hall by reflections of the sound at inner walls of the concert hall, comprising:

right and left main speaker means for respectively sounding right and left input audio signals as right and left main channel audio signals;

right and left phase shifter means respectively supplied with said right and left input audio signals for, by shifting phases thereof, generating respective right and left output signals; and right and left sub-speaker means respectively supplied with said right and left output signals from said right and left phase shifter means as right and left sub-channel audio signals for sounding said right and left sub-channel audio signals;

said right and left main speaker means and said right and left sub-speaker means are disposed in such a relation to each other that general direction of sounds generated from said right and left main speaker means respectively oppose general directions of sound generated from said right and left sub-speaker means, each of said phase shifter means having a frequency versus phase delay characteristic in which an amount of phase delay increases steeply with frequency in a low frequency range and gradually approaches a very arge constant larger than three throusand degrees in a higher frequency range and said phase shifter means has a corresponding frequency versus delay time characteristic in which the delay becomes larger than 100 msec as the frequency decreases below 50 Hz and becomes smaller as the frequency increases, each of said right and left phase shifter means comprises a plurality of mutually cascaded phase shifting circuits respectively having an identical circuit constructions and cascaded in about seventeen stages or more to produce an overall phase delay of over three thousand degrees, each of the phase shifting circuits comprises an operational amplifier, a resistor $R_1$ connected between an input terminal of said phase shifting circuit and an inverting input terminal of said operational amplifier, a resistor $R_2$ connected between an output side of said operational amplifier and said inverting input terminal, a resistor $R_p$ connected between said input terminal and a non-inverting input terminal of said operational amplifier and a capacitor $C_p$ connected between the non-inverting input terminal of said operational amplifier and ground, and the phase shifting circuit has a characteristic of a transfer function $G_1(s)$ represented by $$G_1(s) = \left(\frac{1 - \tau_1 \cdot s}{1 + \tau_1 \cdot s}\right)$$

where $\tau_1$ is a time constant defined as $\tau_1 = R_p \cdot C_p$, and s is a Laplace's operator, and each of said plurality of phase shifting circuits respectively have identical circuit constants, and each of said right and left phase shifter means has a characteristic of a transfer function G(s) described by $$G(s) = \left(\frac{1 - \tau_1 \cdot s}{1 + \tau_1 \cdot s}\right)^n.$$

2. A multi-channel reproducing system as claimed in claim 1 in which resistances of said resistors $R_1$ and $R_2$ in each of said phase shifting circuits are the same, and the gain of said phase shifting circuit is unity throughout the whole frequency range.

* * * * *